(12) United States Patent
Sung et al.

(10) Patent No.: US 10,903,131 B2
(45) Date of Patent: Jan. 26, 2021

(54) SEMICONDUCTOR PACKAGES INCLUDING BRIDGE DIE SPACED APART FROM SEMICONDUCTOR DIE

(71) Applicant: SK hynix Inc., Icheon-si (KR)

(72) Inventors: Ki Jun Sung, Cheongju-si (KR); Sungkyu Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 16/197,130

(22) Filed: Nov. 20, 2018

(65) Prior Publication Data

US 2019/0333834 A1 Oct. 31, 2019

(30) Foreign Application Priority Data

Apr. 30, 2018 (KR) .................. 10-2018-0050264

(51) Int. Cl.
*H01L 23/31* (2006.01)
*H01L 23/538* (2006.01)
*H01L 21/56* (2006.01)
*H01L 23/00* (2006.01)

(52) U.S. Cl.
CPC ........ *H01L 23/3128* (2013.01); *H01L 21/565* (2013.01); *H01L 21/568* (2013.01); *H01L 23/5383* (2013.01); *H01L 23/5389* (2013.01); *H01L 24/96* (2013.01); *H01L 2224/12105* (2013.01); *H01L 2924/181* (2013.01)

(58) Field of Classification Search
CPC . H01L 23/3128; H01L 21/565; H01L 21/568; H01L 23/5383; H01L 23/5389; H01L 24/96; H01L 2224/12105; H01L 2924/181
See application file for complete search history.

(56) References Cited

U.S. PATENT DOCUMENTS

| 8,263,439 | B2 | 9/2012 | Marimuthu et al. | |
|---|---|---|---|---|
| 2011/0024916 | A1* | 2/2011 | Marimuthu | ......... H01L 23/3128 257/774 |
| 2015/0235915 | A1* | 8/2015 | Liang | .................. H01L 21/486 361/764 |
| 2016/0043047 | A1* | 2/2016 | Shim, II | .................. H01L 21/56 257/773 |
| 2018/0151501 | A1 | 5/2018 | Yu et al. | |
| 2019/0206799 | A1* | 7/2019 | Keser | .................. H01L 21/6836 |

FOREIGN PATENT DOCUMENTS

| KR | 101236798 B1 | 2/2013 |
|---|---|---|
| KR | 101874803 B1 | 8/2018 |

* cited by examiner

*Primary Examiner* — Fernando L Toledo
*Assistant Examiner* — Neil R Prasad
(74) *Attorney, Agent, or Firm* — William Park & Associates Ltd.

(57) ABSTRACT

A semiconductor package includes a semiconductor die and a bridge die. The bridge die includes through vias, and the through vias are connected to post bumps. The through vias are electrically connected to the semiconductor die by redistribution lines.

20 Claims, 10 Drawing Sheets

SEMICONDUCTOR PACKAGES INCLUDING BRIDGE DIE SPACED APART FROM SEMICONDUCTOR DIE

CROSS-REFERENCE TO RELATED APPLICATIONS

The present application claims priority under 35 U.S.C 119(a) to Korean Application No. 10-2018-0050264, filed on Apr. 30, 2018, which is incorporated herein by references in its entirety.

BACKGROUND

1. Technical Field

Various embodiments of the present disclosure generally relate to semiconductor package technologies and, more particularly, to semiconductor packages including a bridge die spaced apart from a semiconductor die.

2. Related Art

Recently, semiconductor packages having a high density and capable of operating at a high speed have been required in various electronic systems. In addition, the semiconductor packages have been developed to have a structure of a relatively small form factor. In order to realize such semiconductor packages, a lot of effort has been focused on flip chip stack technology. Moreover, in order to realize the semiconductor packages having a reduced thickness, a lot of effort has been focused on wafer level package technology.

SUMMARY

According to an embodiment, a semiconductor package includes a semiconductor die on which contact pads are disposed, a bridge die disposed to be spaced apart from the semiconductor die, through vias penetrating the bridge die, post bumps connected to first ends of the through vias to protrude from a top surface of the bridge die, and a mold layer disposed to cover the bridge die to surround first side surfaces of the post bumps. The mold layer reveals top surfaces of the post bumps. The redistribution lines include via pads connected to second ends of the through vias and extension lines connected to the via pads. The via pads are arrayed in a first column, a second column, and a third column. The extension lines include first extension lines connecting the via pads in the first column to a first group of contact pads among the contact pads, second extension lines connecting the via pads in the second column to a second group of contact pads among the contact pads, and third extension lines connecting the via pads in the second column to the via pads in the third column.

According to an embodiment, a semiconductor package includes a semiconductor die, a bridge die, post bumps, a mold layer, and redistribution lines. The semiconductor die includes a first surface on which contact pads are disposed, a second surface located opposite to the contact pads, and second side surfaces extending from edges of the first surface to edges of the second surface. The bridge die includes a third surface which is coplanar with the first surface, a fourth surface which is opposite to the third surface and is located at a different level from the second surface, a third side surface facing one of the second side surfaces, and through vias extending from the third surface to the fourth surface. The post bumps are connected to first ends of the through vias to protrude from the fourth surface of the bridge die and to have first side surfaces facing one of the second side surfaces. The mold layer is disposed to cover the fourth surface of the bridge die, to surround the first side surfaces of the post bumps, to fill a space between the second side surfaces of the semiconductor die and the first side surfaces of the post bumps, and to reveal top surfaces of the post bumps. The redistribution lines electrically connect the contact pads to second ends of the through vias.

According to an embodiment, a semiconductor package includes a semiconductor die on which contact pads are disposed, a bridge die spaced apart from the semiconductor die and configured to include through vias penetrating a body of the bridge die, post bumps connected to first ends of the through vias to protrude from a top surface of the bridge die, and a mold layer filling a space between the bridge die and the semiconductor die. The mold layer extends to surround side surfaces of the post bumps and to reveal top surfaces of the post bumps. Redistribution lines are disposed to electrically connect second ends of the through vias to the contact pads.

According to an embodiment, a semiconductor package includes a plurality of sub-packages vertically stacked. Each of the plurality of sub-packages includes a semiconductor die on which contact pads are disposed, a bridge die disposed to be spaced apart from the semiconductor die, through vias penetrating the bridge die, post bumps connected to first ends of the through vias to protrude from a top surface of the bridge die, and a first mold layer disposed to cover the bridge die and to surround first side surfaces of the post bumps. The first mold layer reveals top surfaces of the post bumps. Redistribution lines are disposed to include via pads connected to second ends of the through vias and extension lines connected to the via pads. The via pads are arrayed in a first column, a second column, and a third column. The extension lines include first extension lines connecting the via pads in the first column to a first group of contact pads among the contact pads, second extension lines connecting the via pads in the second column to a second group of contact pads among the contact pads, and third extension lines connecting the via pads in the second column to the via pads in the third column.

DETAILED DESCRIPTION

Figure 1:
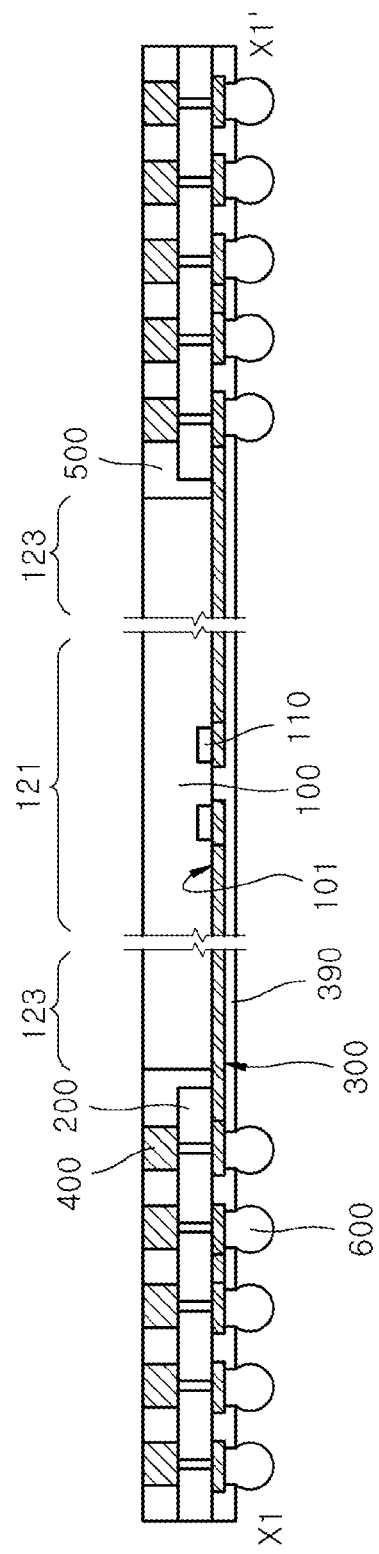
FIGS. 1 to 3 are cross-sectional views illustrating a semiconductor package according to an embodiment.

The terms used herein may correspond to words selected in consideration of their functions in embodiments of the present disclosure, and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
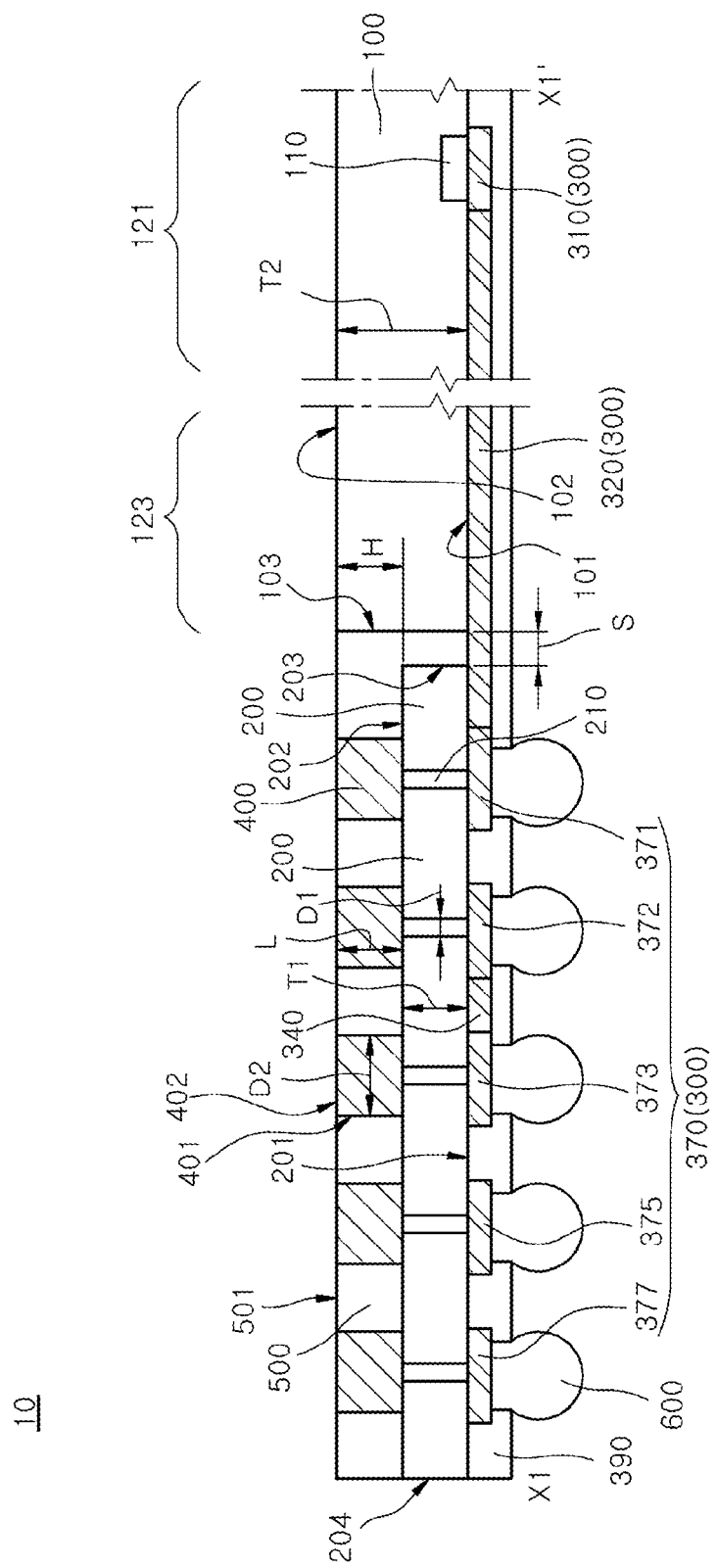
Figure 3:
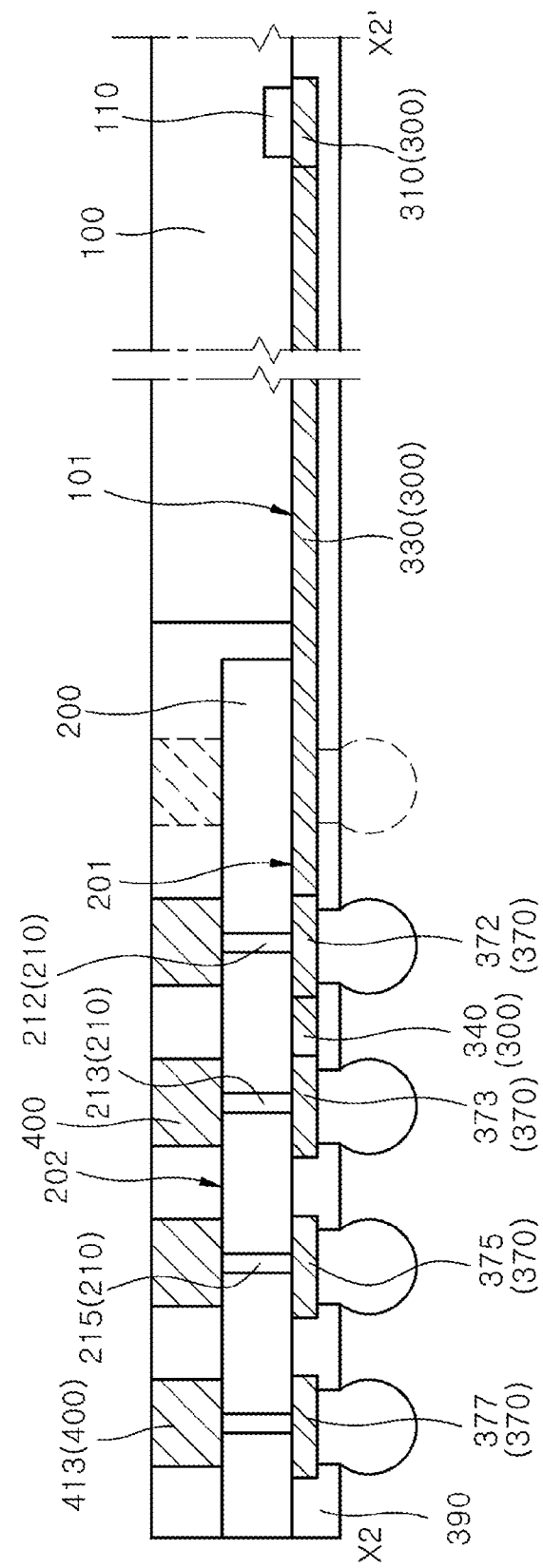
Figure 4:
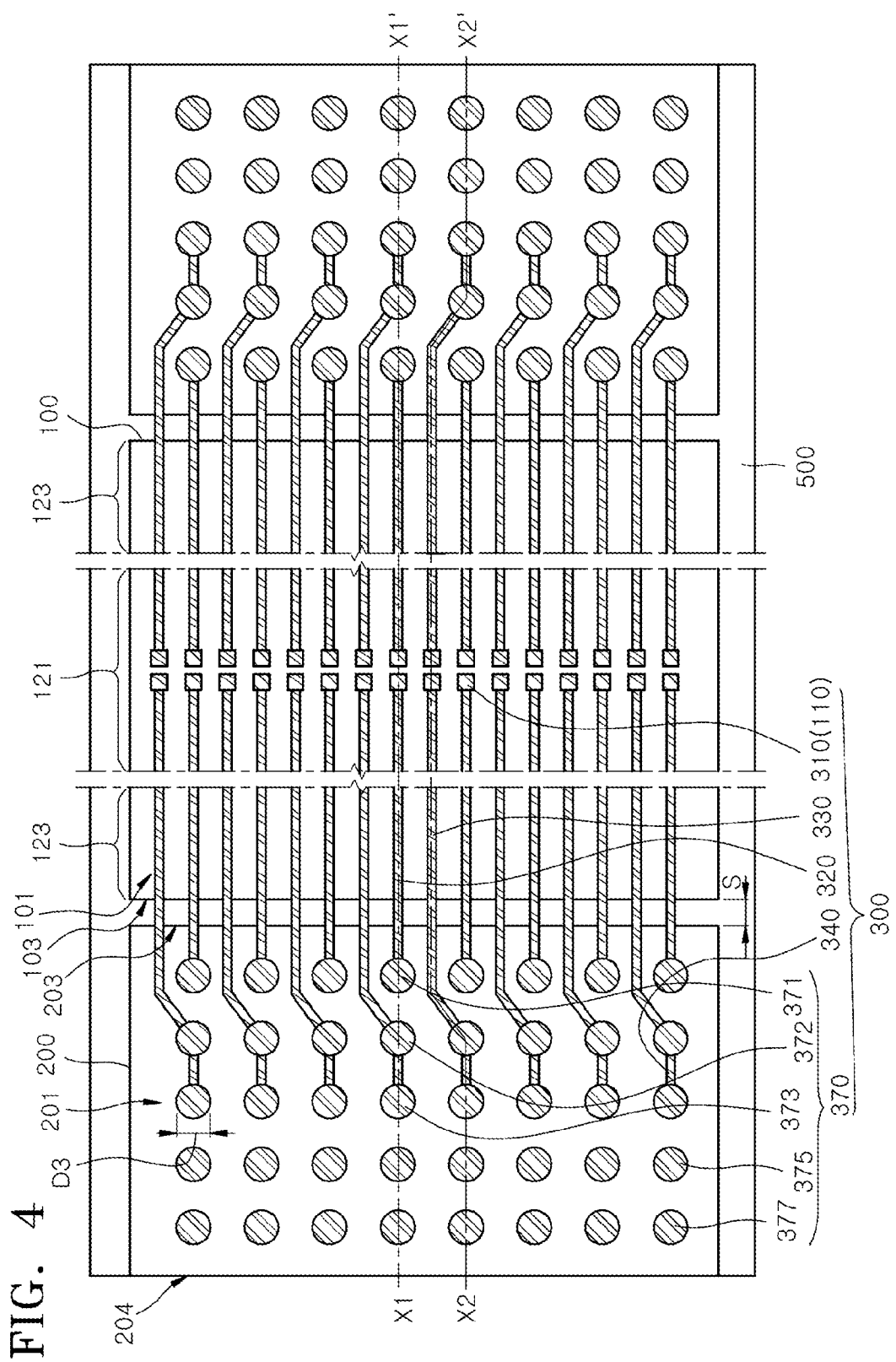
FIGS. 4 and 5 are plan views illustrating a semiconductor package according to an embodiment.
Figure 5:
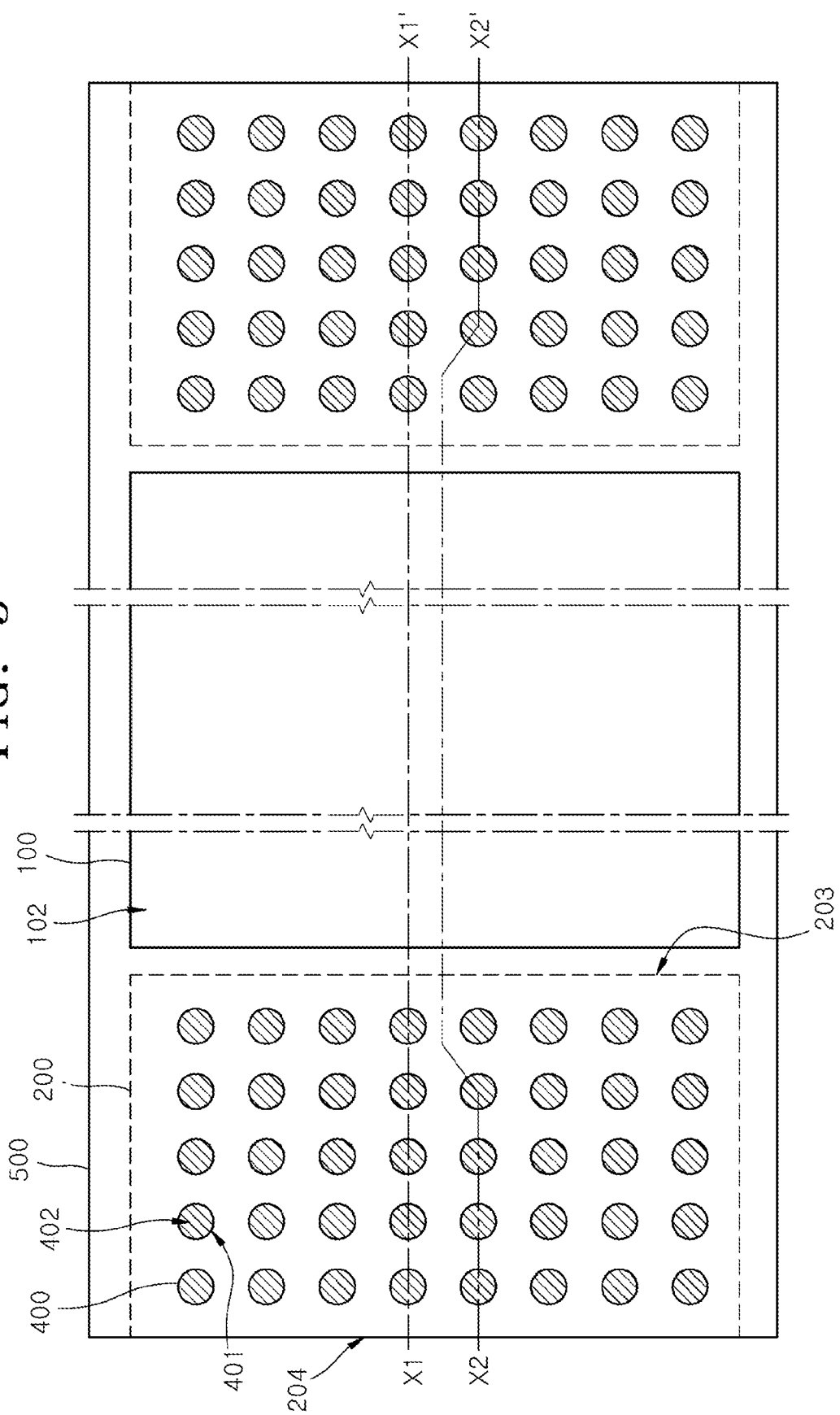

FIGS. 1 to 3 are cross-sectional views illustrating a semiconductor package 10 according to an embodiment. FIGS. 4 and 5 are plan views illustrating the semiconductor package 10 of FIGS. 1 to 3. FIG. 1 is a cross-sectional view taken along a line X1-X1' of FIGS. 4 and 5. FIG. 2 is an enlarged cross-sectional view taken along portions of a line X1-X1' of FIGS. 4 and 5. FIG. 3 is an enlarged cross-sectional view taken along portions of a line X2-X2' of FIGS. 4 and 5. FIG. 4 is a plan view taken at a level of a first surface 101 of a semiconductor die 100 included in the semiconductor package 10 of FIG. 1. For the purpose of ease and convenience in explanation, a dielectric layer 390 and connectors 600 illustrated in FIG. 1 are omitted in FIG. 4. FIG. 5 is a plan view taken at a level of a second surface 102 of the semiconductor die 100 included in the semiconductor package 10 of FIG. 1.

Referring to FIG. 1, the semiconductor package 10 may be configured to include the semiconductor die 100, a bridge die 200, and redistribution lines 300. The bridge die 200 may be disposed to be spaced apart from the semiconductor die 100 in a plan view. The bridge die 200 may include one die disposed at only one side of the semiconductor die 100 or may include two dies respectively disposed at both sides of the semiconductor die 100. Each of the redistribution lines 300 may be configured to include a conductive pattern that electrically connects the semiconductor die 100 to the bridge die 200. The semiconductor package 10 may further include conductive post bumps 400 attached to the bridge die 200 and a mold layer 500. In addition, the semiconductor package 10 may further include the connectors 600, each of which is connected to a portion of each of the redistribution lines 300. The dielectric layer 390 may be disposed to cover the redistribution lines 300 to electrically isolate the redistribution lines 300 from each other.

Referring to FIGS. 1 and 2, the semiconductor die 100 may have the first surface 101 on which the dielectric layer 390 is disposed, the second surface 102 located opposite to the dielectric layer 390, and second side surfaces 103 extending from edges of the first surface 101 to edges of the second surface 102. The first surface 101 of the semiconductor die 100 may correspond to an active surface on which integrated circuits are disposed. The second surface 102 of the semiconductor die 100 may correspond to a bottom surface or a backside surface of the semiconductor die 100, which is opposite to the active surface. The terms "first" and "second" in the first surface 101 and the second surface 102 are only used to distinguish the surfaces from each other, but not used to mean a particular sequence of the surfaces.

Contact pads 110 may be disposed on the first surface 101 of the semiconductor die 100. The contact pads 110 may be conductive patterns that are used as paths for electrically connecting the semiconductor die 100 to an external device or system. The contact pads 110 may be center pads which are arrayed in a center region 121 of the semiconductor die 100, as illustrated in FIG. 4. The contact pads 110 may be arrayed in two columns on the first surface 101 of the center region 121. The semiconductor die 100 may include the center region 121 and two edge regions 123 respectively located at both sides of the center region 121.

Referring to FIG. 2, the bridge die 200 may be disposed to be spaced apart from the second side surface 103 of the semiconductor die 100. The bridge die 200 may have a third surface 201 and a fourth surface 202 which are opposite to each other as well as a third side surface 203 and a fourth side surface 204 which are opposite to each other. The bridge die 200 may be disposed such that the third surface 201 of the bridge die 200 faces the same direction as the first surface 101 of the semiconductor die 100. The third surface 201 of the bridge die 200 may be coplanar with the first surface 101 of the semiconductor die 100. That is, the third surface 201 of the bridge die 200 may be located at substantially the same level as the first surface 101 of the semiconductor die 100.

Referring to FIGS. 2 and 4, the bridge die 200 may be disposed beside the semiconductor die 100 such that the third side surface 203 of the bridge die 200 faces the second side surface 103 of the semiconductor die 100. The bridge die 200 may be spaced apart from the semiconductor die 100 by a certain distance S.

Referring to FIG. 2, there may be a level difference H between the fourth surface 202 of the bridge die 200 and the second surface 102 of the semiconductor die 100. The bridge die 200 may be disposed beside the semiconductor die 100 such that the fourth surface 202 of the bridge die 200 and the second surface 102 of the semiconductor die 100 constitute a step structure. The bridge die 200 may be thinner than the semiconductor die 100. A thickness T1 (also, referred to as a first thickness) corresponding to a distance between the third and fourth surfaces 201 and 202 of the bridge die 200 may be less than a thickness T2 (also, referred to as a second thickness) corresponding to a distance between the first and second surfaces 101 and 102 of the semiconductor die 100. In an embodiment, the thickness T1 of the bridge die 200 may be approximately half the thickness T2 of the semiconductor die 100.

The bridge die 200 may include through vias 210 that penetrate a body of the bridge die 200 to extend from the third surface 203 to the fourth surface 204. The body of the bridge die 200 may be comprised of a semiconductor material such as a silicon material. If the body of the bridge die 200 is comprised of a silicon material, the through vias 210 may be formed using a silicon processing technology. In such a case, the through vias 210 may be through silicon vias (TSVs) having a relatively fine diameter D1 (also, referred to as a first diameter in the specification). The through vias 210 may be formed of a conductive metal material, for example, a metal material including a copper material.

Since the thickness T1 of the bridge die 200 is relatively less than the thickness T2 of the semiconductor die 100, a length (corresponding to a height) of the through vias 210 may be relatively short. For example, if the bridge die 200 is replaced with a thick bridge die having substantially the same thickness as the semiconductor die 100, through vias penetrating the thick bridge die may have a length which is greater than the length of the through vias 210. However, according to an embodiment, the through vias 210 may be formed to penetrate the bridge die 200 which is thinner than the semiconductor die 100. Thus, the through vias 210 may be formed to have a relatively short length. In order to form the through vias penetrating the thick bridge die and having a fine diameter, it may be necessary to increase an aspect ratio of through via holes of the through vias. There may be limitations in increasing an aspect ratio of the through via holes without increasing the diameter of the through via holes. That is, if a length of the through vias increases, a diameter of the through vias may also increase. However, according to the described embodiment, the thickness T1 of the bridge die 200 may have a relatively small value. Thus, the through vias 210 penetrating the bridge die 200 may be formed to have a relatively short length with a fine diameter D1. Accordingly, it may be possible to increase the number of the through vias 210 disposed in the bridge die 200 because the through vias 210 are formed to have the fine diameter D1.

Referring to FIG. 2, the conductive post bumps 400 may be disposed to protrude from the fourth surface 202 of the bridge die 200. The conductive post bumps 400 may be electrically connected to the through vias 210, respectively. The conductive post bumps 400 may be disposed to respectively overlap with the through vias 210 in a plan view. The conductive post bumps 400 may protrude from the fourth surface 202 of the bridge die 200 such that a side surface of first side surfaces 401 of each of the conductive post bumps 400 faces an upper portion of the second side surface 103 of the semiconductor die 100.

The semiconductor package 10 may include the mold layer 500 covering the fourth surface 202 of the bridge die 200. The mold layer 500 may be formed to cover the fourth surface 202 of the bridge die 200. The mold layer 500 may be formed to surround the side surfaces of the conductive post bumps 400. The mold layer 500 may be formed to directly cover the first side surfaces 401 of the conductive post bumps 400. The mold layer 500 may be formed to reveal top surfaces 402 of the conductive post bumps 400. The top surfaces 402 of the conductive post bumps 400 may be coplanar with a top surface 501 of the mold layer 500.

Other connectors (not illustrated) may be attached or connected to the top surfaces 402 of the conductive post bumps 400 to electrically connect the conductive post bumps 400 to another semiconductor package or an external device. The conductive post bumps 400 may be surrounded by the mold layer 500. The conductive post bumps 400 may substantially penetrate portions of the mold layer 500 covering the fourth surface 202 of the bridge die 200. Thus, the conductive post bumps 400 may act as extension lines for extending the electrical paths of the through vias 210 up to the top surface 501 of the mold layer 500.

Whereas a space between the through vias 210 is filled with a semiconductor material such as a silicon material, a space between the conductive post bumps 400 may be filled with a dielectric layer such as the mold layer 500 including an epoxy molding compound (EMC) material.

Since the through vias 210 penetrate the body of the bridge die 200 comprised of a semiconductor material, an impedance component of each of the through vias 210 may increase as compared with a case in which the through vias 210 penetrate an insulation substrate. In addition, if the through vias 210 are disposed in a limited region or a limited space, a distance between the through vias 210 may be reduced to cause a crosstalk phenomenon due to noise signals to occur more frequently. The crosstalk phenomenon may affect a signal transmission characteristic or a signal integrity characteristic of semiconductor packages while the semiconductor packages operate at a high frequency. According to the described embodiment, a space between the post bumps 400 may be filled with a dielectric material, for example, an epoxy molding compound (EMC) material. Thus, the suppressing of a total crosstalk phenomenon of the semiconductor package 10 may be improved due to the presence of a dielectric material (i.e., the mold layer 500) filling a space between the post bumps 400 even though the through vias 210 are disposed to penetrate the bridge die 200 comprised of a semiconductor material. For example, a silicon material may have a dielectric constant of approximately 11.68 at a frequency of 1.0 KHz at room temperature, and an EMC material may have a dielectric constant of approximately 3.7 at a frequency of 1.0 KHz at room temperature. This difference in dielectric constant between the bridge die 200 and the mold layer 500 may influence electrical characteristics such as a signal transmission characteristic or a signal integrity characteristic of the semiconductor package 10.

Each of the post bumps 400 may have a second diameter D2 which is greater than the first diameter D1 of each of the through vias 210. Since the first diameter D1 of each of the through vias 210 is less than the second diameter D2 of each of the post bumps 400 connected to the through vias 210, a distance between the through vias 210 may be relatively greater than a distance between the post bumps 400. That is, the post bumps 400 may be disposed such that a distance between the post bumps 400 is less than a distance between the through vias 210. For example, a distance between adjacent post bumps may be less than a distance between the corresponding adjacent through vias. In addition, a space between the post bumps 400 may be filled with a dielectric material, and a space between the through vias 210 may be filled with a semiconductor material. Since a distance between the through vias 210 may be relatively greater than a distance between the post bumps 400, noise generated due to interference between signals transmitted through adjacent through vias 210 may be reduced.

As described above, in order to reduce the noise generated due to interference between signals transmitted through adjacent through vias 210, it may be necessary to increase the distance between the through vias 210. In order to increase the distance between the through vias 210 without changing a pitch size of the through vias 210, it may require that the first diameter D1 is reduced. In order to form through vias 210 having the first diameter D1 corresponding to a fine diameter which is less than the second diameter D2 penetrating the bridge die 200, it may be required to reduce the thickness T1 of the bridge die 200. According to an embodiment, the bridge die 200 may be provided to have the thickness T1 which is less than the thickness T2 of the semiconductor die 100. Thus, each of the through vias 210 may be formed to have a through silicon via (TSV) shape. As a result, a distance between the through vias 210 may be increased to suppress generation of noise due to interference between signals transmitted through adjacent through vias 210.

Each of the post bumps 400 may have a shape of a metal post including a copper material. A length L (i.e., a height) of the post bumps 400 may be less than the second diameter D2 of the post bumps 400. For example, each of the post bumps 400 may have the length L of approximately 60 micrometers. The length L of the post bumps 400 may be about the same as the first thickness T1 of the bridge die 200. For example, the bridge die 200 may have the first thickness T1 of approximately 50 micrometers. Each of the post bumps 400 may have the second diameter D2 of approximately 100 micrometers. In contrast, each of the through vias 210 may have the first diameter D1 of approximately 0.5 micrometers. Since the post bumps 400 are formed to have a relatively large diameter (i.e., the second diameter D2) as compared with the through vias 210, connectors (not illustrated) such as solder bumps may be directly connected to the respective top surfaces 402 of the post bumps 400. Thus, extra conductive pads for increasing contact areas between the connectors (not illustrated) and the top surfaces 402 of the post bumps 400 might not be required.

The mold layer 500 may extend to fill a space between the second side surface 103 of the semiconductor die 100 and the first side surfaces 401 of the post bumps 400. The mold layer 500 may extend to substantially cover an entire portion of the second side surface 103 of the semiconductor die 100. The mold layer 500 may further extend to cover the third side surface 203 of the bridge die 200, which faces the second side surface 103 of the semiconductor die 100. The mold layer 500 may further extend to fill a space between the second side surface 103 of the semiconductor die 100 and the third side surface 203 of the bridge die 200.

Referring to FIGS. 2 and 5, the mold layer 500 may be formed to reveal the second surface 102 of the semiconductor die 100. The second surface 102 of the semiconductor die 100 may be coplanar with the top 501 of the mold layer 500. That is, the top 501 of the mold layer 500 may be located at substantially the same level as the second surface 102 of the semiconductor die 100. The top surfaces 402 of the post bumps 400 may be coplanar with the second surface 102 of the semiconductor die 100. Since the mold layer 500 is formed to reveal the second surface 102 of the semiconductor die 100, a total thickness of the semiconductor package 10 may have a reduced thickness as compared with a case where the mold layer 500 is formed to cover an entire portion of the semiconductor die 100.

The mold layer 500 may be formed to reveal the fourth side surface 204 of the bridge die 200 opposite to the semiconductor die 100. A heat radiation efficiency of the semiconductor package 10 may be improved by forming the mold layer 500 to reveal the fourth side surface 204 of the bridge die 200. The fourth side surface 204 of the bridge die 200 and the second surface 102 of the semiconductor die 100, which are revealed by the mold layer 500, may act as heat radiation paths of the semiconductor package 10.

The mold layer 500 may cover the third side surface 203 of the bridge die 200 and the second side surface 103 of the semiconductor die 100 and may extend to cover the fourth surface 202 of the bridge die 200 and the first side surfaces 401 of the post bumps 400. Accordingly, a binding force of the mold layer 500 to the bridge die 200 may be improved because the post bumps 400 are combined with the through vias 210 and the mold layer 500 extends to surround the first side surfaces 401 of the post bumps 400.

Referring again to FIGS. 2 and 4, the semiconductor package may further include the redistribution lines 300. The redistribution lines 300 may be disposed to electrically connect the semiconductor die 100 to the through vias 210. Each of the redistribution lines 300 may include a conductive pattern that electrically connects one of the contact pads 110 of the semiconductor die 100 to any one of the through vias 210. The redistribution lines 300 may be formed to include a metal material such as an aluminum (Al) material, a copper (Cu) material, a gold (Au) material, etc.

Each of the redistribution lines 300 may include a pad overlap portion 310, an extension line 320 or 330+340, and a via pad 370. The extension lines 320 and 330+340 may include a first extension line 320, a second extension line 330, and a third extension line 340. The pad overlap portion 310 may be bonded to any one of the contact pads 110 of the semiconductor die 100. The pad overlap portion 310 may be in contact with one of the contact pads 110 of the semiconductor die 100 to electrically connect the one of the contact pads 110 to any one of the extension lines 320, 330, and 340. The pad overlap portion 310 may overlap with any one of the contact pads 110 of the semiconductor die 100 to have a pad shape. The via pads 370 of the redistribution lines 300 may be arrayed to have a pitch size which is greater than a pitch size of the contact pads 110.

The via pad 370 may be a conductive pattern connected to any one of the through vias 210 of the bridge die 200. First ends of the through vias 210 may be respectively connected to the post bumps 400, and second ends of the through vias 210 may be respectively connected to the via pads 370 of the redistribution lines 300. The via pads 370 of the redistribution lines 300 may be disposed on the third surface 201 of the bridge die 200 opposite to the post bumps 400, and the post bumps 400 may be disposed on the fourth surface 202 of the bridge die 200 opposite to the via pads 370. The through vias 210 may correspond to conductive patterns that electrically connect the via pads 370 to the respective post bumps 400. The via pads 370 may be disposed to overlap with the respective through vias 210 in a plan view, and the post bumps 400 may be disposed to overlap with the respective through vias 210 in a plan view. Thus, the via pads 370 may also be disposed to overlap with the post bumps 400, respectively, when viewed from a plan view. The via pads 370 may be conductive patterns having a third diameter D3 which is substantially equal to or about the same as the second diameter D2 of the post bumps 400. The via pads 370 may have a third diameter D3 which is greater than the first diameter D1 of the through vias 210.

The via pads 370 of the redistribution lines 300 may be arrayed in a plurality of columns on the third surface 201 of the bridge die 200. As illustrated in a plan view of FIG. 4, the via pads 370 may include via pads 371 arrayed in a first column, via pads 372 arrayed in a second column, via pads 373 arrayed in a third column, via pads 375 arrayed in a fourth column, and via pads 377 arrayed in a fifth column. The first to fifth columns may be sequentially located to get farther from the semiconductor die 100. The via pads 370 may be arrayed in a checkerboard shape (i.e., a matrix form) as illustrated in FIG. 4. However, the embodiment illustrated in FIG. 4 may be merely one of various embodiments of the present disclosure. For example, in some other embodiments, the via pads 370 in each column may be arrayed in a zigzag fashion along a column direction when viewed from a plan view.

The first extension lines 320 of the redistribution lines 300 may correspond to extension lines that electrically connect the via pads 371 arrayed in the first column to a first group of the pad overlap portion 310. That is, the first extension lines 320 may electrically connect the via pads 371 arrayed in the first column to a first group of the contact pads 110. Some of the through vias 210 may be electrically connected to some of the contact pads 110 of the semiconductor die 100 through the via pads 371 arrayed in the first column, the first extension lines 320, and the first group of the pad overlap portion 310. The first extension lines 320 may be conductive patterns that extend from the first surface 101 of the semiconductor die 100 onto the third surface 201 of the bridge die 200 across the mold layer 500.

Referring to FIGS. 3 and 4, the second extension lines 330 of the redistribution lines 300 may correspond to extension lines that electrically connect the via pads 372 arrayed in the second column to a second group of the pad overlap portion 310. That is, the second extension lines 330 may electrically connect the via pads 372 arrayed in the second column to a second group of the contact pads 110. Some of the through vias 210 may be electrically connected to some of the contact pads 110 of the semiconductor die 100 through the via pads 372 arrayed in the second column, the second extension lines 330, and the second group of the pad overlap portion 310. The second extension lines 330 may be conductive patterns that extend from the first surface 101 of the semiconductor die 100 onto the third surface 201 of the bridge die 200 across the mold layer 500. As illustrated in FIG. 4, the first extension lines 320 and the second extension lines 330 may be alternately disposed.

The third extension lines 340 of the redistribution lines 300 may correspond to extension lines that electrically connect the via pads 372 arrayed in the second column to the via pads 373 arrayed in the third column. Since the third extension lines 340 electrically connect the via pads 372 arrayed in the second column to the via pads 373 arrayed in the third column, first through vias 212 coupled to the via pads 372 in the second column among the through vias 210 may be electrically connected to second through vias 213 coupled to the via pads 373 in the third column among the through vias 210. The third extension lines 340 may electrically connect the first through vias 212 to the second through vias 213 adjacent to the first through vias 212. The third extension lines 340 may be disposed on the third surface 201 of the bridge die 200.

One of the first through vias 212 and one of the second through vias 213 may be electrically connected to any one of the second extension lines 330 by any one of the third extension lines 340. Even though signals are abnormally transmitted through the first through vias 212, the signals may be normally transmitted to the second extension lines 330 through the second through vias 213. Thus, it may be possible to realize reliable signal paths of the semiconductor die 100 included in the semiconductor package 10. Whereas the second extension lines 330 provide data signal paths, the first extension lines 320 may be used as power supply lines including power voltage lines and ground voltage lines.

The via pads 375 arrayed in the fourth column and the via pads 377 arrayed in the fifth column may be disposed on the third surface 201 of the bridge die 200 to act as first dummy pads. That is, the via pads 375 in the fourth column and the via pads 377 in the fifth column may be electrically disconnected and isolated from the first to third extension lines 320, 330, and 340. Since the via pads 375 in the fourth column and the via pads 377 in the fifth column correspond to the first dummy pads, the through vias 210 connected to the via pads 375 in the fourth column and the via pads 377 in the fifth column may also correspond to first dummy through vias 215 which are electrically isolated. The post dumps 400 connected to the first dummy through vias 215 may also correspond to first dummy post bumps 413 which are electrically isolated. The first dummy pads 375 and 377, the first dummy through vias 215, and the first dummy post bumps 413 may be provided as redundant preliminary members.

Referring again to FIG. 2, the semiconductor package 10 may include the dielectric layer 390 that reveals the via pads 370 and covers the first to third extension lines 320, 330, and 340 and the pad overlap portions 310 to electrically isolate the extension lines 320, 330, and 340 from each other. The dielectric layer 390 may be formed to cover the first surface 101 of the semiconductor die 100, the third surface 201 of the bridge die 200, and the mold layer 500 between the semiconductor die 100 and the bridge die 200. The dielectric layer 390 may include a solder resist layer revealing the via pads 370.

The connectors 600 may be attached to the revealed via pads 370 to electrically connect the semiconductor package 10 to an external device or another semiconductor package. The connectors 600 may be realized using solder bumps or solder balls.

Figure 6:
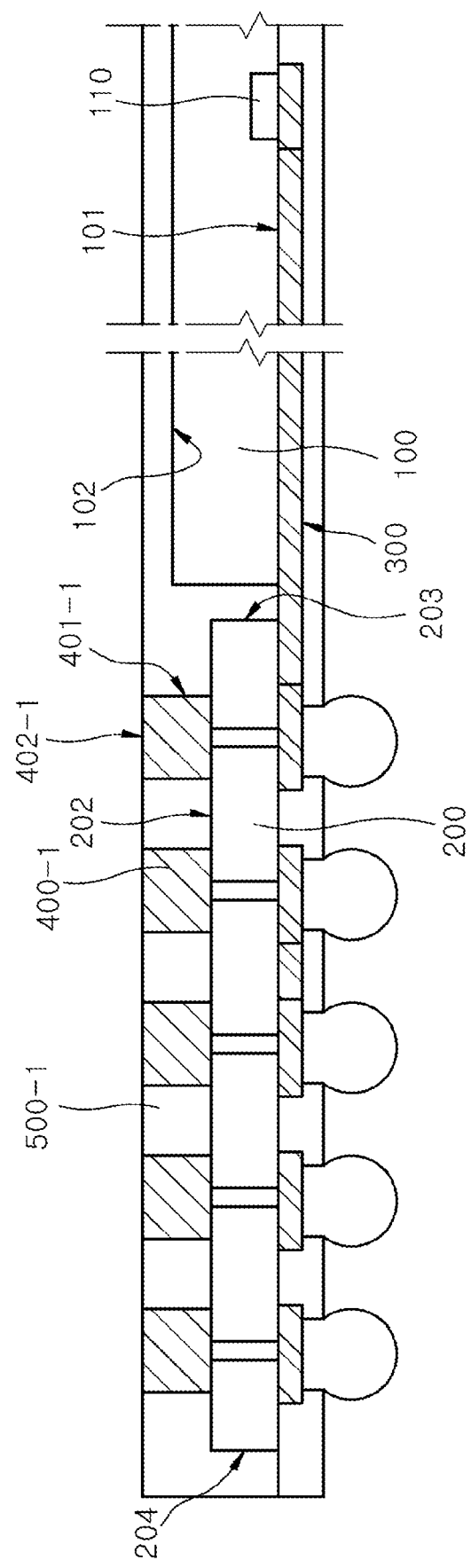
FIG. 6 is a cross-sectional view illustrating a semiconductor package according to an embodiment.

FIG. 6 is a cross-sectional view illustrating a semiconductor package 11 according to an embodiment. In FIG. 6, members having the same shapes as illustrated in FIGS. 1 to 5 denote substantially the same elements. In FIG. 6, the same reference numerals as used in FIGS. 1 to 5 denote substantially the same elements.

Referring to FIG. 6, the semiconductor package 11 may include a mold layer 500-1 having an expanded shape of the mold layer 500 included in the semiconductor package 10 of FIG. 2. The mold layer 500-1 may surround first side surfaces 401-1 of post bumps 400-1 and may reveal top surfaces 402-1 of the post bumps 400-1. The post bumps 400-1 may penetrate the mold layer 500-1 to have the same function as the post bumps 400 illustrated in FIG. 2. The mold layer 500-1 may cover the fourth surface 202 of the bridge die 200 and may extend to cover the fourth side surface 204 of the bridge die 200 opposite to the semiconductor die 100. Since the mold layer 500-1 covers the fourth surface 202 of the bridge die 200 to protect the bridge die 200, the bridge die 200 may not be exposed to external environment. Thus, the mold layer 500-1 may suppress damaging of the bridge die 200 by the external environment or formation of cracks in the bridge die 200. In addition, the mold layer 500-1 may extend to cover the second surface 102 of the semiconductor die 100 opposite to the contact pads 110.

Figure 7:
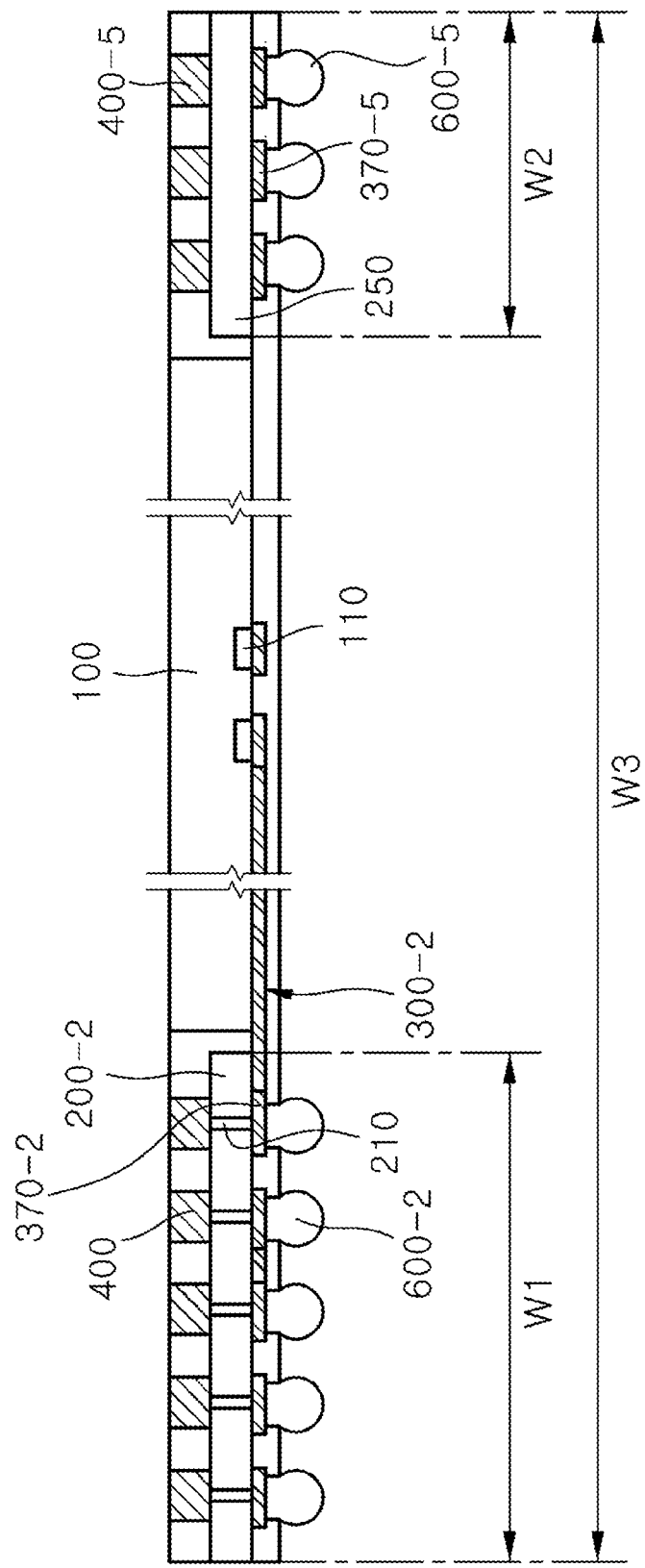
FIG. 7 is a cross-sectional view illustrating a semiconductor package according to an embodiment.
Figure 8:
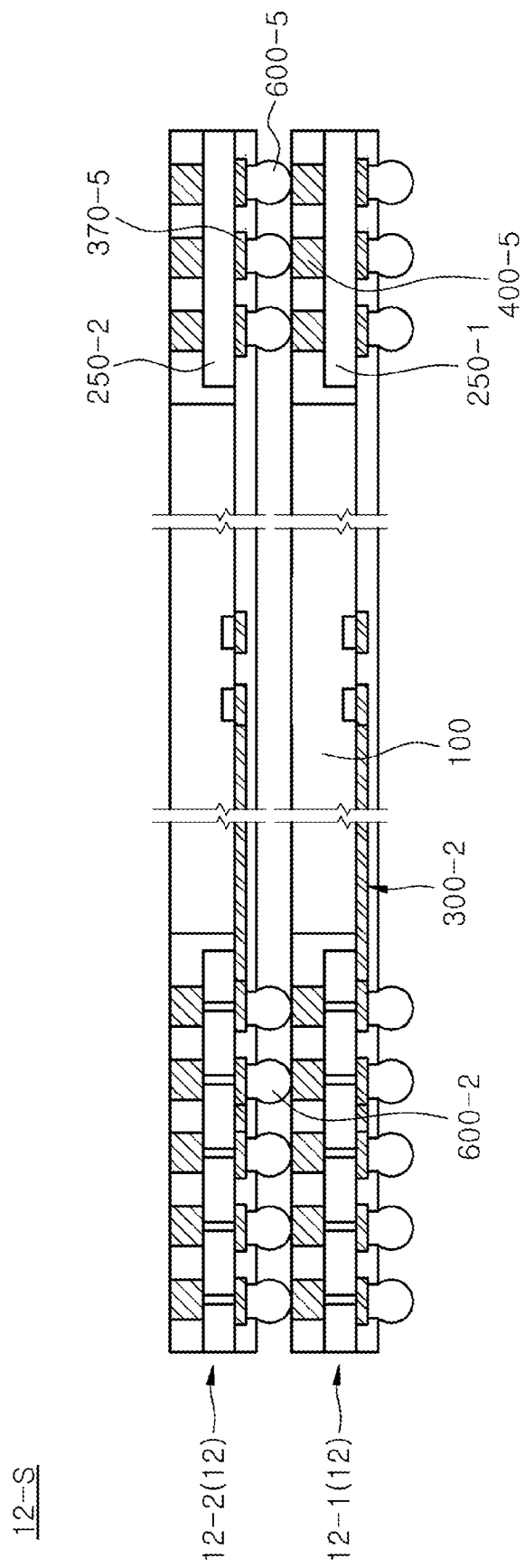
FIG. 8 is a cross-sectional view illustrating a semiconductor package according to an embodiment.

FIG. 7 is a cross-sectional view illustrating a semiconductor package 12 according to an embodiment. FIG. 8 is a cross-sectional view illustrating a semiconductor package 12-S according to an embodiment. The semiconductor package 12-S illustrated in FIG. 8 may correspond to a stack package including a couple of the semiconductor packages 12 which are vertically stacked. In FIGS. 7 and 8, members having the same shapes as illustrated in FIGS. 1 to 5 denote substantially the same elements. In FIGS. 7 and 8, the same reference numerals as used in FIGS. 1 to 5 denote substantially the same elements.

Referring to FIG. 7, the semiconductor package 12 may include a bridge die 200-2 located at one side of the semiconductor die 100. The semiconductor package 12 may also include redistribution lines 300-2 that electrically connect the through vias 210 of the bridge die 200-2 to the contact pads 110 of the semiconductor die 100. A dummy die 250 may be located at another side of the semiconductor die 100 opposite to the bridge die 200-2.

The dummy die 250 may have no through vias unlike the bridge die 200-2. Nevertheless, second dummy pads 370-5 may be disposed on the dummy die 250. Dummy connectors 600-5 may be attached to the second dummy pads 370-5 as connectors 600-2 are attached to via pads 370-2 which are connected to the through vias 210 penetrating a body of the bridge die 200-2. The second dummy pads 370-5 may be electrically isolated from the semiconductor die 100. Second dummy post bumps 400-5 disposed on the dummy die 250 may also be electrically isolated from the semiconductor die 100.

The dummy die 250 may correspond to a semiconductor die having a width W2 which is less than a width W1 of the bridge die 200-2. Thus, a total width W3 of the semiconductor package 12 may be reduced as compared with a case where the dummy die 250 has the same width as the bridge die 200-2. The dummy die 250 and the bridge die 200-2 may have substantially the same length in a direction perpendicular to a width direction in a plan view. In other embodiments, the dummy die 250 may have substantially the same size as the bridge die 200-2. Alternatively, a size of the dummy die 250 may be about the same as a size of the bridge die 200-2.

Referring to FIGS. 7 and 8, since the dummy die 250 and the bridge die 200-2 are respectively located at both sides of the semiconductor die 100, the semiconductor package 12 may have a stable structure due to a bump connection structure of the dummy die 250. Accordingly, when a first sub-package 12-1 having the same configuration as the semiconductor package 12 and a second sub-package 12-2 having the same configuration as the semiconductor package 12 are vertically stacked to provide the semiconductor package 12-S, the semiconductor package 12-S may be well balanced.

The first sub-package 12-1 and the second sub-package 12-2 may be physically bonded to each other and may be electrically connected to each other by the connectors 600-2. In such a case, the second dummy post bumps 400-5 disposed on a dummy die 250-1 of the first sub-package 12-1 may be bonded to the second dummy pads 370-5 disposed on a dummy die 250-2 of the second sub-package 12-2 using the dummy connectors 600-5. The dummy connectors 600-5, the second dummy post bumps 400-5, the second dummy pads 370-5, and the dummy dies 250-1 and 250-2 may act as balances for preventing the second sub-package 12-2 from being inclined. That is, the dummy connectors 600-5, the second dummy post bumps 400-5, the second dummy pads 370-5, and the dummy dies 250-1 and 250-2 may be introduced to help the second sub-package 12-2 keep a balance when the second sub-package 12-2 is stacked on the first sub-package 12-1. Therefore, the dummy connectors 600-5, the second dummy post bumps 400-5, the second dummy pads 370-5, and the dummy dies 250-1 and 250-2 may provide a symmetrical structure of the semiconductor package 12-S to prevent physical defects of the semiconductor package 12-S from being generated due to a non-symmetrical structure of the semiconductor package 12-S.

Figure 9:
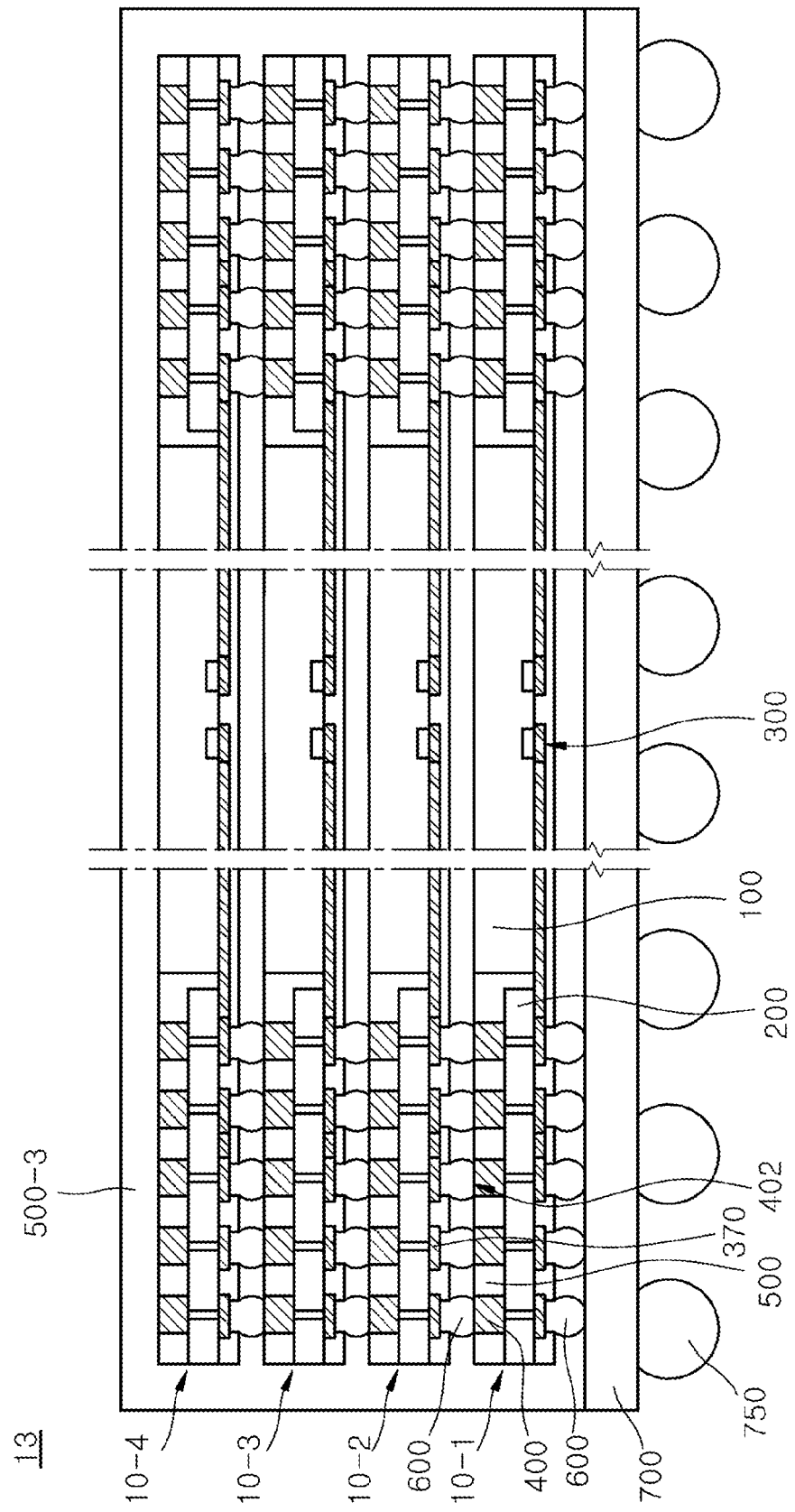
FIG. 9 is a cross-sectional view illustrating a semiconductor package according to an embodiment.

FIG. 9 is a cross-sectional view illustrating a semiconductor package 13 according to an embodiment. In FIG. 9, members having the same shapes as illustrated in FIGS. 1 to 5 denote substantially the same elements. In FIG. 9, the same reference numerals as used in FIGS. 1 to 5 denote substantially the same elements.

Referring to FIG. 9, the semiconductor package 13 may be configured to include a plurality of sub-packages (i.e., first to fourth sub-packages 10-1, 10-2, 10-3, and 10-4) which are vertically stacked on a package substrate 700. The package substrate 700 may include an interconnection structure layer having circuit interconnection lines, for example, a printed circuit board (PCB) or an interposer. Although FIG. 9 illustrates an example in which the semiconductor package 13 includes the first to fourth sub-packages 10-1, 10-2, 10-3, and 10-4, the number of the sub-packages may be set to be different according to various embodiments. Outer connectors 750 may be attached to the package substrate 700 to electrically connect the semiconductor package 13 to another electronic system.

Each of the first to fourth sub-packages 10-1, 10-2, 10-3, and 10-4 may have substantially the same configuration as the semiconductor package 10 described with reference to FIGS. 1 to 5. Each of the first to fourth sub-packages 10-1, 10-2, 10-3, and 10-4 may be configured to include the semiconductor die 100, a couple of the bridge dies 200 respectively disposed at both sides of the semiconductor die 100, the post bumps 400, the mold layer 500 (hereinafter, referred to as a first mold layer), and the redistribution lines 300. The first to fourth sub-packages 10-1, 10-2, 10-3, and 10-4 may be electrically connected to each other by the connectors 600. The connectors 600 may electrically connect the via pads 370 of an upper sub-package (e.g., the second sub-package 10-2) to the post bumps 400 of a lower sub-package (e.g., the first sub-package 10-1). The connectors 600 may be directly bonded to the post bumps 400 of the lower sub-package (e.g., the first sub-package 10-1). The top surface 402 of each of the post bumps 400 may have a sufficient area for being in contact with any one of the connectors 600. Thus, no extra conductive pads on the post bumps 400 may be required.

The semiconductor package 13 may further include a second mold layer 500-3 covering and protecting a stack structure of the first to fourth sub-packages 10-1, 10-2, 10-3, and 10-4. The second mold layer 500-3 may extend to fill spaces between the first to fourth sub-packages 10-1, 10-2, 10-3, and 10-4. The second mold layer 500-3 may include an encapsulant material such as an epoxy molding compound (EMC) material.

The semiconductor package 13 of FIG. 9 illustrates an example in which the semiconductor package 10 of FIG. 1 is employed in a module package or is used as sub-packages, which are capable of stacking, of a stack package. The bridge die (200 of FIG. 1) of the semiconductor package (10 of FIG. 1) may provide a vertical interconnection structure for electrically connecting the first to fourth sub-packages 10-1, 10-2, 10-3, and 10-4, which are vertically stacked, to each other. The semiconductor package 11 or 12 illustrated in FIG. 6 or 7 may also be used as sub-packages constituting a stack package such as the semiconductor package 13 of FIG. 9.

As described above, the semiconductor package 13 of FIG. 9 may employ the semiconductor package 10 of FIG. 1 as each of the sub-packages which are vertically stacked to constitute the semiconductor package 13. Thus, the semiconductor package 13 may provide a compact package with a large capacity.

According to various embodiments, the semiconductor package 10 may be provided to include the semiconductor die 100 and the bridge die 200 spaced part from the semiconductor die 100. In addition, the semiconductor package 10 including the semiconductor die 100 and the bridge die 200 spaced part from the semiconductor die 100 may be used as each of a plurality of sub-packages, which are vertically stacked, to provide the semiconductor package 13 corresponding to a stack package.

Figure 10:
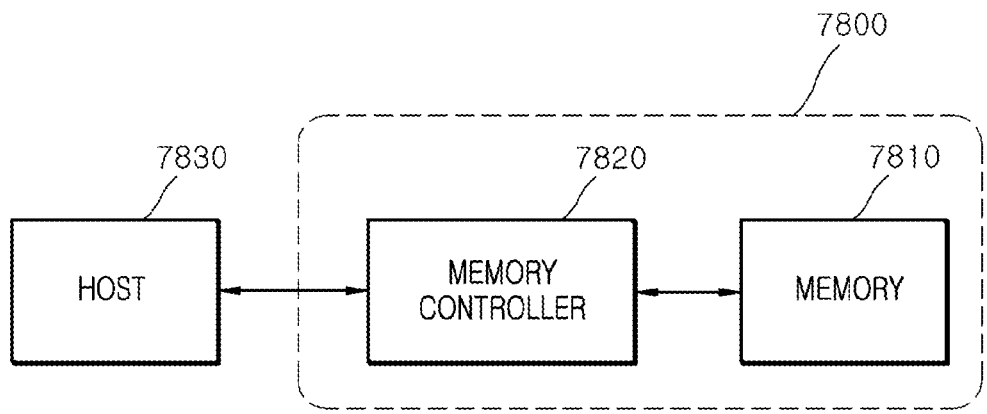
FIG. 10 is a block diagram illustrating an electronic system employing a memory card including at least one of semiconductor packages according to various embodiments.

FIG. 10 is a block diagram illustrating an electronic system including a memory card 7800 employing at least one semiconductor package according to embodiments of the present disclosure. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one semiconductor package according to embodiments of the present disclosure.

The memory 7810 may include a nonvolatile memory device fabricated according to embodiments of the present disclosure. The memory controller 7820 may control the memory 7810 such that stored data is read out or data is stored in response to a read/write request from a host 7830.

Figure 11:
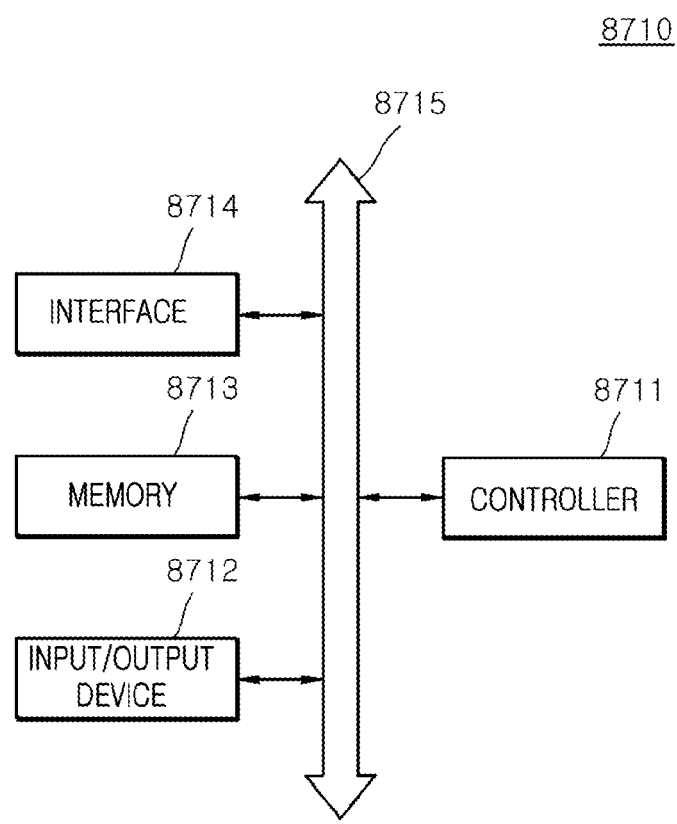
FIG. 11 is a block diagram illustrating another electronic system including at least one of semiconductor packages according to various embodiments.

FIG. 11 is a block diagram illustrating an electronic system 8710 including at least one semiconductor package according to embodiments of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more semiconductor packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution) or WiBro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor package comprising:
   a semiconductor die on which contact pads are disposed;
   a bridge die disposed to be spaced apart from the semiconductor die;
   through vias penetrating the bridge die;
   post bumps connected to first ends of the through vias to protrude from a top surface of the bridge die;
   a mold layer disposed to cover the bridge die, to surround first side surfaces of the post bumps, and to reveal top surfaces of the post bumps; and
   redistribution lines including via pads connected to second ends of the through vias and extension lines connected to the via pads,
   wherein the via pads are arrayed in a first column, a second column, and a third column, said vias being arranged as columns when the vias are viewed in a plan view, and
   wherein the extension lines include:
      first extension lines connecting the via pads in the first column to a first group of contact pads among the contact pads;

second extension lines connecting the via pads in the second column to a second group of contact pads among the contact pads; and third extension lines connecting the via pads in the second column to the via pads in the third column.

2. The semiconductor package of claim 1, wherein each of the via pads has a diameter which is greater than a diameter of each of the through vias.

3. The semiconductor package of claim 1, wherein the via pads are arrayed on the bridge die to have a pitch size which is greater than a pitch size of the contact pads on the semiconductor die.

4. The semiconductor package of claim 1, wherein a thickness of the bridge die is less than a thickness of the semiconductor die.

5. The semiconductor package of claim 4, wherein the thickness of the bridge die is substantially half the thickness of the semiconductor die.

6. The semiconductor package of claim 1,
wherein the bridge die is disposed at one side of the semiconductor die such that a second side surface of the semiconductor die faces a third side surface of the bridge die; and
wherein the mold layer extends to cover the second side surface of the semiconductor die and the third side surface of the bridge die and to fill a space between the semiconductor die and the bridge die.

7. The semiconductor package of claim 6, wherein the mold layer reveals a fourth side surface of the bridge die opposite to the semiconductor die.

8. The semiconductor package of claim 6, wherein the mold layer extends to cover a fourth side surface of the bridge die opposite to the semiconductor die.

9. The semiconductor package of claim 6,
wherein the post bumps are disposed such that the first side surfaces of the post bumps face the second side surface of the semiconductor die; and
wherein the mold layer fills a space between the second side surface of the semiconductor die and the first side surfaces of the post bumps.

10. The semiconductor package of claim 9,
wherein the mold layer reveals a surface of the semiconductor die opposite to the contact pads; and
wherein the top surfaces of the post bumps are located at substantially the same level as the surface of the semiconductor die opposite to the contact pads.

11. The semiconductor package of claim 9, wherein the mold layer extends to cover a surface of the semiconductor die opposite to the contact pads.

12. The semiconductor package of claim 1, further comprising:
first dummy pads disposed on the bridge die to be adjacent to the via pads and to be electrically disconnected from the first, second, and third extension lines;
first dummy through vias penetrating the bridge die to be connected to the first dummy pads; and
first dummy post bumps connected to the first dummy through vias.

13. The semiconductor package of claim 1, further comprising connectors connected to the via pads.

14. The semiconductor package of claim 1, further comprising an additional bridge die disposed at a side of the semiconductor die opposite to the bridge die.

15. The semiconductor package of claim 1, further comprising:
a dummy die disposed at a side of the semiconductor die opposite to the bridge die; and
second dummy pads disposed on the dummy die and electrically isolated from the semiconductor die.

16. The semiconductor package of claim 15, wherein the dummy die has a width which is less than a width of the bridge die.

17. The semiconductor package of claim 1,
wherein each of the post bumps has a diameter which is greater than a diameter of each of the through vias;
wherein a distance between the post bumps is less than a distance between the through vias.

18. The semiconductor package of claim 1,
wherein a space between the post bumps is filled with an insulation material; and
wherein a space between the through vias is filled with a semiconductor material constituting a body of the bridge die.

19. A semiconductor package comprising:
a semiconductor die having a first surface on which contact pads are disposed, a second surface located opposite to the contact pads, and second side surfaces extending from edges of the first surface to edges of the second surface;
a bridge die having a third surface which is substantially coplanar with the first surface, a fourth surface which is opposite to the third surface and is located at a different level from the second surface, a third side surface facing one of the second side surfaces, and through vias extending from the third surface to the fourth surface, the vias having first and second opposing ends, the vias being located and arranged in the bridge die as columns that have first and second opposing ends, the first and second opposing ends of the vias corresponding to the first and second opposing ends of the columns when one end of the vias in the bridge die are viewed in a plan view of said bridge die;
post bumps connected to first ends of the through vias to protrude from the fourth surface of the bridge die and to have first side surfaces facing one of the second side surfaces;
a mold layer disposed to cover the fourth surface of the bridge die, to surround the first side surfaces of the post bumps, to fill a space between the second side surfaces of the semiconductor die and the first side surfaces of the post bumps, and to reveal top surfaces of the post bumps; and
redistribution lines electrically connecting the contact pads to second ends of the through vias.

20. A semiconductor package comprising:
a semiconductor die on which contact pads are disposed;
a bridge die spaced apart from the semiconductor die and configured to include through vias penetrating a body of the bridge die, the vias having first and second opposing ends, the vias being located and arranged in the bridge die as columns that have first and second opposing ends, the first and second opposing ends of the vias corresponding to the first and second opposing ends of the columns when one end of the vias in the bridge die are viewed in a plan view of said bridge die;
post bumps connected to first ends of the through vias to protrude from a top surface of the bridge die;
a mold layer filling a space between the bridge die and the semiconductor die, extending to surround side surfaces of the post bumps, and revealing top surfaces of the post bumps; and redistribution lines electrically connecting second ends of the through vias to the contact pads.

\* \* \* \* \*